United States Patent
Osaka et al.

(10) Patent No.: US 6,654,270 B2
(45) Date of Patent: *Nov. 25, 2003

(54) DIRECTIONAL COUPLING MEMORY MODULE

(75) Inventors: Hideki Osaka, Oiso (JP); Toyohiko Komatsu, Yokohama (JP); Takashi Tsunehiro, Ebina (JP); Koichi Kimura, Kamakura (JP); Susumu Hatano, Higashimurayama (JP); Kazuya Ito, Hamura (JP); Toshio Sugano, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/191,112

(22) Filed: Jul. 10, 2002

(65) Prior Publication Data

US 2003/0007379 A1 Jan. 9, 2003

Related U.S. Application Data

(63) Continuation of application No. 09/569,876, filed on May 12, 2000, now Pat. No. 6,438,012.

(30) Foreign Application Priority Data

May 12, 1999 (JP) .............................. 11-130957
Apr. 20, 2000 (JP) ........................ 2000-126233

(51) Int. Cl.[7] .............................. G11C 5/02; G11C 5/06
(52) U.S. Cl. .............................. 365/51; 365/52; 365/63
(58) Field of Search .............................. 365/51, 52, 63, 365/226

(56) References Cited

U.S. PATENT DOCUMENTS

| | | | |
|---|---|---|---|
| 3,516,065 A | 6/1970 | Bolt et al. | 235/200 PF |
| 3,619,504 A | 11/1971 | De Veer | 375/257 |
| 3,764,941 A | 10/1973 | Nick | 333/116 |
| 3,786,418 A | 1/1974 | Nick | 375/257 |
| 4,380,080 A | 4/1983 | Rattlingourd | 375/257 |
| 5,119,398 A | 6/1992 | Webber, Jr. | 375/257 |
| 5,365,205 A | 11/1994 | Wong | 333/109 |
| 5,376,904 A | 12/1994 | Wong | 333/109 |
| 5,638,402 A | 6/1997 | Osaka et al. | 375/257 |
| 5,945,886 A | 8/1999 | Millar | 174/250 |
| 6,137,709 A * | 10/2000 | Boaz et al. | 365/51 |
| 6,172,895 B1 * | 1/2001 | Brown et al. | 365/52 |
| 6,366,520 B1 * | 4/2002 | Huber | 365/226 |

FOREIGN PATENT DOCUMENTS

| | | |
|---|---|---|
| JP | 7141079 | 6/1995 |
| JP | 8188366 | 7/1996 |

OTHER PUBLICATIONS

"Limits of Electrical Signaling (Transmitted Equalization)", IEEE Hot Inteconnect V (Sep. 21–23, 1997), p. 48.

(List continued on next page.)

*Primary Examiner*—Trong Phan
(74) *Attorney, Agent, or Firm*—Antonelli, Terry, Stout & Kraus, LLP

(57) ABSTRACT

Conventionally, wiring length occupied by a directional coupler decides intervals between modules connected to a bus, and those intervals can not be shortened furthermore. Accordingly, the intervals between modules are wide and high-density mounting is not possible. In the present invention, a directional coupler in a memory bus is formed by a leader line from a controller and a leader line from a memory chip and contained within a memory module. Accordingly, pitch between the modules can be reduced and high-density mounting can be realized.

6 Claims, 12 Drawing Sheets

OTHER PUBLICATIONS

S. Honda, "Present and Future of Technologies for Build-up Type Multilayer Boards", S.C. Laboratory, Inc., Tokyo, Japan, pp. 462–468 (Japanese only).

P. Allen, et al, "CMOS Analog Circuit Design", Comparator with Hysteresis, pp. 347–357.

R. Poon, "Computer Circuit Electrical Design", Principal Engineer and Manager of Circut Engineering, Amdahl Corp., pp. 194–207.

Taguchi, et al., "Comparison of Small Amplitude Interfaces for bus systems for 100 MHz era", Nikkei Electronics, No. 591, Sep. 27, 1993, pp. 269–290.

* cited by examiner

MEMORY MODULE

TIME
MC DRIVE

TIME
CHIP DRIVE

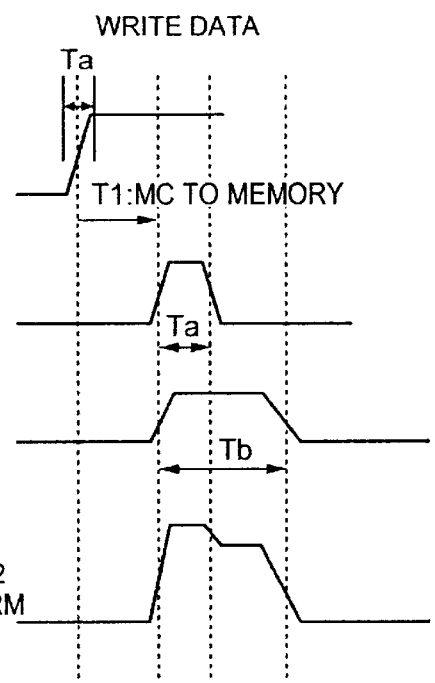
FIG.10(1) OUTPUT WAVEFORM OF MC 10-1
FIG.10(2) FWXT BY C1 AT THE 1-2 BRANCH POINT
FIG.10(3) BWXT BY C2 AT THE 1-2 BRANCH POINT
FIG.10(4) INPUT WAVEFORM FOR 10-2 (SUPERIMPOSED WAVEFORM FROM (2) AND (3))
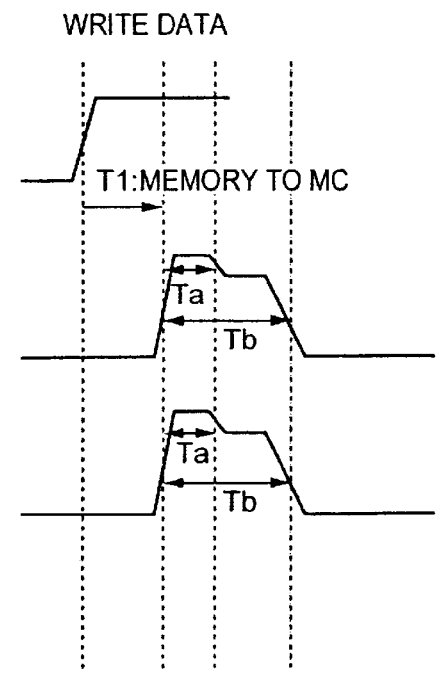
FIG.11(1) OUTPUT WAVEFORM OF CHIP 10-2
FIG.11(2) WAVEFORM ON THE SIDE OF CHIP 10-1
FIG.11(3) WAVEFORM ON THE SIDE OF RTT

DIRECTIONAL COUPLING MEMORY MODULE

The present application is a continuation of application Ser. No. 09/569,876, filed May 12, 2000, now U.S. Pat. No. 6,438,012, and is related to application Ser. No. 07/313,384, filed Sep. 27, 1994, now U.S. Pat. No. 5,638,402 entitled "FAST DATA TRANSFER BUS" by Hideki OSAKA; application Ser. No. 09/429,441, filed Oct. 28, 1999, now U.S. Pat. No. 6,496,886, entitled "DIRECTIONAL COUPLING BUS SYSTEM USING PRINTED BOARD", by Hideki OSAKA; and application Ser. No. 09/570,349, filed May 12, 2000, entitled "DIRECTIONAL COUPLING MEMORY MODULE", by Hideki OSAKA the contents of which are incorporated herein by reference.

BACKGROUND OF THE INVENTION

The present invention relates to a technique of signal transmission between devices such as multiple processors and memories (for example, between digital circuits constructed by CMOSs or between their functional blocks) in an information processing apparatus, and in particular to a technique for speeding up bus transmission in which a plurality of elements are connected to a same transmission line for transferring data. In particular, the present invention relates to a memory module having a signal generator (a directional coupler) built-in.

As a bus system that is connected with many nodes and intended for high-speed data transfer, is mentioned a non-contact bus line of U.S. Pat. No. 5,638,402. FIG. 3 shows the basic system of the conventional technique. In the conventional technique, data transmission between two nodes is realized by utilizing crosstalk, i.e., using a directional coupler. Namely, that is a technique in which transfer between a bus master 10-1 and slaves 10-2–10-8 is carried out utilizing crosstalk between two lines, i.e., between a line 1-1 and a line 1-2–1-8. This conventional technique is suitable for transfer between a bus master 10-1 and slaves 10-2–10-8, or data transfer between a memory controller and memories.

However, in the conventional technique of U.S. Pat. No. 5,638,402, the line length occupied by a directional coupler decides a module interval. Accordingly, in order to shorten the module interval, it is necessary to shorten the line length of the directional coupler. However, shorter line length becomes a cause of reducing the transmission efficiency, i.e., degree of coupling, and thus, it is impossible to make the interval less than a certain length. Thus, a first problem is that it is necessary to realize high-density mounting of memories by making intervals between memory modules smaller.

A second problem is that only a few chips can be connected for signal transmission of the RTZ (Return to Zero) system using directional couplers. In other words, it is a problem that many chips cannot be connected since signal level generated in a directional coupler is low. In detail, when many chips are mounted, input capacitance of the chips becomes larger, so that the RTZ signal level becomes lower. Further, since branches for wiring arise, reflection distortion becomes larger. From those reasons, the above-mentioned problem is caused. Thus, in the case of a bus that uses directional couplers, it is a problem that bulk memory modules such as multi-bank structure cannot be arranged.

Further, a third problem is that, as transmission speed becomes higher in high-speed data transmission, waveform becomes dull owing to frequency-dependent effects such as the skin effect. This is a phenomenon that pulse waveform becomes dull at its rising and falling shoulders. This influence appears as increase of skew when a receiver takes in pulse waveform. Namely, since the shoulders of pulse waveform inputted into the receiver become dull, time when a signal exceeds or falls short of the reference voltage (Vref) of the receiver increases. As a result, receiver's take-in time increases, causing increase of the skew.

The reason why the skin effect makes the shoulders of the pulse dull is described as follows.

A high-speed pulse has a high-frequency component depending on the reciprocal of its transition (rise or fall) time. For example, the frequency band (fknee) of a pulse having the transition time Tr can be written as:

$fknee = 0.35/Tr$

Accordingly, when it is assumed that a pulse of 1 Gbps is transmitted and 30% of it is the transition time, then, fknee=0.35/(0.3 [ns])~1 GHz. At this time, resistance increase owning to the skin effect is calculated as follows.

The volume resistivity $\Delta$ of copper at 20 [° C.] is $1.72 \times 10^{-8}$ [$\Omega \cdot m$]. In the case of a standard line (linewidth 0.1 [mm] and line thickness 0.030 [mm]) in a board, DC resistance becomes 5.7 [m$\Omega$/mm]. Further, the resistance per unit length owing to the skin effect is:

$r = 2.6 \times 10^{-6} \sqrt{f} [\Omega/mm]$ and, at 1 GHz, it becomes:

$r = 82 [m\Omega/mm]$

Thus, in comparison with the DC resistance 6 [m$\Omega$/mm], the resistance in the transition time increases 13 times. Here, the symbol ^ expresses the power.

Namely, the high resistance appears only at the transition time, and this leads to the dull waveform. This is because a resistance component becomes larger as the frequency becomes higher, thus having larger effects at rising and falling times. As a technique for overcoming this, there is a method in which a driver is used to make the pulse waveform steeper at the transition (rise and fall) times. For example, an article, "Limits of Electrical Signaling (Transmitter Equalization)"; IEEE HOT interconnect V (1997, 9/21–23), pp. 48 describes an equalizer system using DAC (Digital Analog Converter) of a driver (transmitter). In this equalizer, the driver changes transition waveform steeply all the more when the quantity of dullness is larger. In the case of using this technique, control of the driver becomes complex and it is difficult to mount many devices on LSI.

A fourth problem is that there are signal propagation delays between a plurality of memory modules, depending on distances of their mounting positions from a memory controller. As a result, time difference are generated in read data and write data. Correction of differences in data arrival times caused by chip positions makes system design very difficult. Thus, removal of these time differences is a problem to be solved.

SUMMARY OF THE INVENTION

As a means for solving the first problem, a directional coupler is formed for a main line within a memory module, by taking in a line (main line) from a memory controller into the inside of this memory module. In other words, by placing the directional coupler not on a mother board but in the memory module, the pitch between the modules can be shortened without being limited by the length of the directional coupler and high-density mounting can be realized.

As a means for solving the second problem, a converter circuit (a transceiver) that converts an RTZ signal to an NRZ (Non Return to Zero) signal is provided on a memory module and a conventional directional coupler is formed on a mother board on which the memory module is mounted. Thus, data transfer for long line length between a memory controller and the memory module is carried out using the directional coupler, and an RTZ signal is demodulated into an NRZ signal by the transceiver placed in the memory module. Thus, within the memory module having shorter line length, data is transferred using the NRZ signal. Accordingly, even in a bus in which a directional coupler is used, many chips can be connected, and a large capacity memory module having, for example, multi-bank structure can be constructed.

As a means for solving the third problem, a directional coupler that can generate forward crosstalk is formed in a T-shape. Thus, by superimposing a backward crosstalk component and a forward crosstalk component at the time of transition of an NRZ signal, signal waveform can be sharpened to equalize dulling of the waveform owing to the skin effect etc. As a result, it is not necessary to control a driver in a special manner, and the structure of LSI becomes simple.

As a means for solving the fourth embodiment, there is provided a folded line that connects a same signal to a plurality of memory chips through directional couplers, the memory chips being located in different positions from a memory controller. Two ends of the folded line are switched with respect to connection, so that delay differences depending on the locations can be eliminated and system design becomes easy. For this end, the directional coupler is connected in a T-shaped as in the means for solving the third problem, and its characteristic that signals are generated in both directions is utilized.

BRIEF DESCRIPTION OF THE DRAWINGS

FIGS. 10(1)-(4) are explanatory views for explaining write operation in a memory system using the T-shaped couplers;

FIGS. 11(1)-(3) are explanatory views for explaining read operation in the memory system using the T-shaped couplers;

DESCRIPTION OF THE PREFERRED EMBODIMENTS

Figure 1:
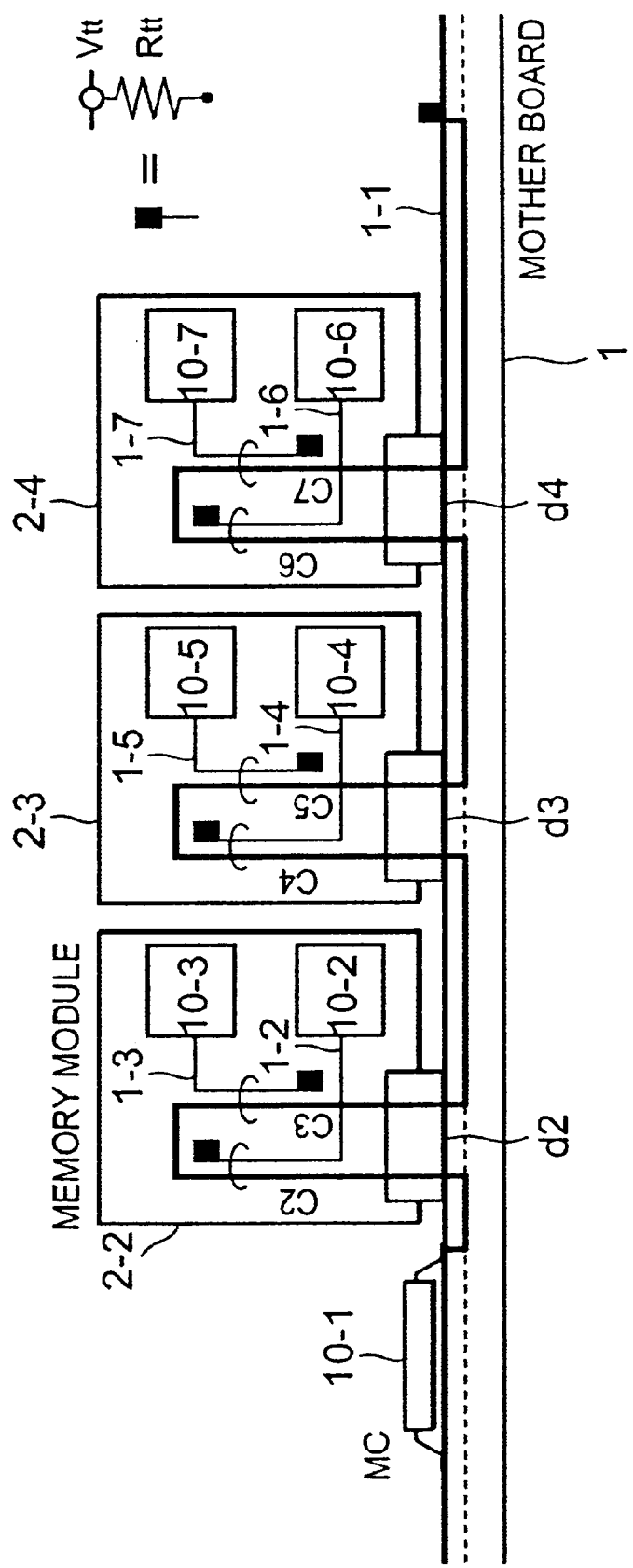
FIG. 1 is a view for explaining a first embodiment.

A first embodiment will be described referring to FIG. 1.

A memory controller (hereinafter referred to MC) 10-1 is an LSI chip having a control function as a memory controller. Memory modules 2-2–2-4 are mounted with memory chips 10-2–10-7. FIG. 1 is a cross section of a printed circuit board called a mother board 1. The mother board 1 is mounted with MC 10-1 and the memory modules 2-2-2-4, and has lines that can transfer data between MC 10-1 and the memory chips 10-2–10-7 within the memory modules 2-2-2-4. Further, the memory modules 2-2–2-4 are connected to the mother board through connectors d2–d4.

MC 10-1 carries out operation of read/write into the memory chips 10-2–10-7. Out of data transfer lines 1-1–1-7 for the mentioned read/write operation, the line 1-1 connected to MC 10-1 is particularly called a main line.

One end of each line 1-1–1-7 is connected to MC 10-1 or a memory chip 10-2–10-7, and the other end is connected to a terminating voltage Vtt via a terminating resistance Rtt. This terminating resistance Rtt connected to the terminating voltage Vtt is expressed by a black rectangle (■). This terminating resistance has an almost same value as a line characteristic impedance of each line 1-1–1-7. Accordingly, signals from the lines 1-1–1-7 are absorbed at those terminations, and thus, those terminations operate to prevent generation of reflection.

Data transfer between MC 10-1 and the memory chips 10-2–10-7 is carried out through directional couplers C2–C7 each shown as a revered letter "C". The directional couplers are equivalent to ones of U.S. Pat. No. 5,638,402. In this conventional technique, data transfer between two nodes is carried out utilizing crosstalk (directional coupler) as coupling between two parallel lines. Thus, transfer between MC (bus master) 10-1 and a memory chip (bus slave) 10-2–10-7 is carried out utilizing crosstalk between two lines, i.e., between the main line 1-1 and a line 1-2–1-7. This crosstalk signal is generated for an edge of a drive pulse, and, after a certain time, returns to the terminating voltage. Accordingly, when the drive signal is a rectangular NRZ signal, a signal generated by a directional coupler is regarded as an RTZ signal, and the directional coupler operates as a converter that converts an NRZ signal to an RTZ signal.

In the modules 2-2-2-4, the directional couplers C2 C7 are arranged in the same direction as the signal propagation direction of the main line 1-1, so that data transfer between MC 10-1 and the memory chips 10-2–10-7 is carried out utilizing backward crosstalk in each coupler. In other words, although, in the modules 2-2-2-4, the couplers C2, C4 and C6 are reverse to the couplers C3, C5 and C7 in their wiring direction, their directions with respect to the signal propagation direction on the main line 1-1 are same and backward, so that backward crosstalk is generated in each of the couplers C2–C7. Of course, the couplers may be arranged so that all of them utilize forward crosstalk.

In a board of the module 2-2, there are the main line 1-1 and the lines 1-2 and 1-3 that are coupled to the main line 1-1, and those lines 1-2 and 1-3 are connected to the memory chips 10-2 and 10-3, respectively. Similarly, also in the memory modules 2-3, 2-4, the lines 1-4, 1-5 and 1-6, 1-7 coupled to the main line 1-1 are arranged. Those main lines 1-1 are serially connected through connectors d2–d4 for connecting respective modules 2-2–2-4, and terminated.

In the memory modules 2-2–2-4, the main line 1-1 is arranged to be folded via signal pins of the connectors d2–d4, and thus each of the connectors d2–d4 has two pins (terminals) for the main line 1-1 for each signal. Further, it is constructed such that the characteristic impedance of the main line 1-1 becomes same in the mother board 1 and each of the memory modules 2-2–2-4. Accordingly, even when the mother board 1 and the memory modules 2-2–2-4 are serially wired, reflection distortion owing to impedance turbulence is small.

Further, in a certain system configuration, it is not necessary to mount all memory modules on connectors. For example, it is the case when a smaller number of memory modules are mounted at the time of shipment, and later, the quantity of memory is enlarged in order to extend the system.

The main line 1-1 wires the modules 2-2–2-4 serially. Accordingly, even when one memory module is lacked, the serial connection of the main line is broken, and data transfer can not be carried out. To cope with this, instead of a module mounted with a memory, a dummy board without a memory may be inserted into a connector. This dummy board has the same terminal arrangement as the memory modules 2-2–2-4, and the two pins of the dummy board are connected by a line having the same characteristic impedance as the line 1-1 on the module so as to avoid breaking the main line 1-1. By this, MC 10-1 can be connected through to the terminating resistance without a break of the main line 1-1, and data transfer between MC 10-1 and the memory chips can be carried out even when the dummy board is inserted into any module position.

Figure 2:
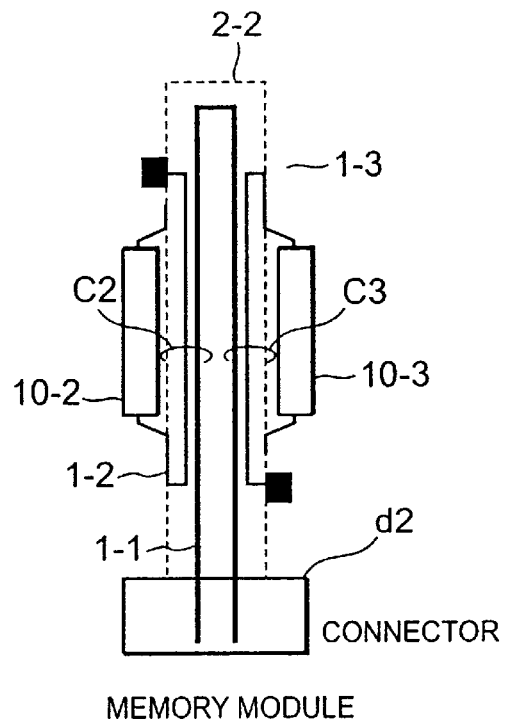
FIG. 2 is a view showing a board arrangement of the first embodiment.

Further, a memory module may be constructed as shown in FIG. 2. FIG. 2 is a cross section showing a state of the memory module 2-2 connected to the connector d2. The memory chips 10-2, 10-3 mounted on the front and back sides of the board of the memory module 2-2 are connected respectively to the lines 1-2, 1-3, which are combined with the main line 1-1 to constitute the couplers C2, C3. The other ends of the lines 1-2, 1-3 are terminated.

Thus, the memory module 2-2 is constructed by a multilayer board, and in one of signal layers, the wired main line 1-1 and memory module 2-2 constitute a first coupler C2. After constituting the coupler C2, this main line 1-1 is folded through a via hole, and is connected in the other signal layer to construct a second coupler C3 in the memory module 2-2. Each of these two couplers C2, C3 is wired so that they do not become noise sources to each other, being arranged in such layer structure that ground and power-supply layers separate them.

Figure 3:
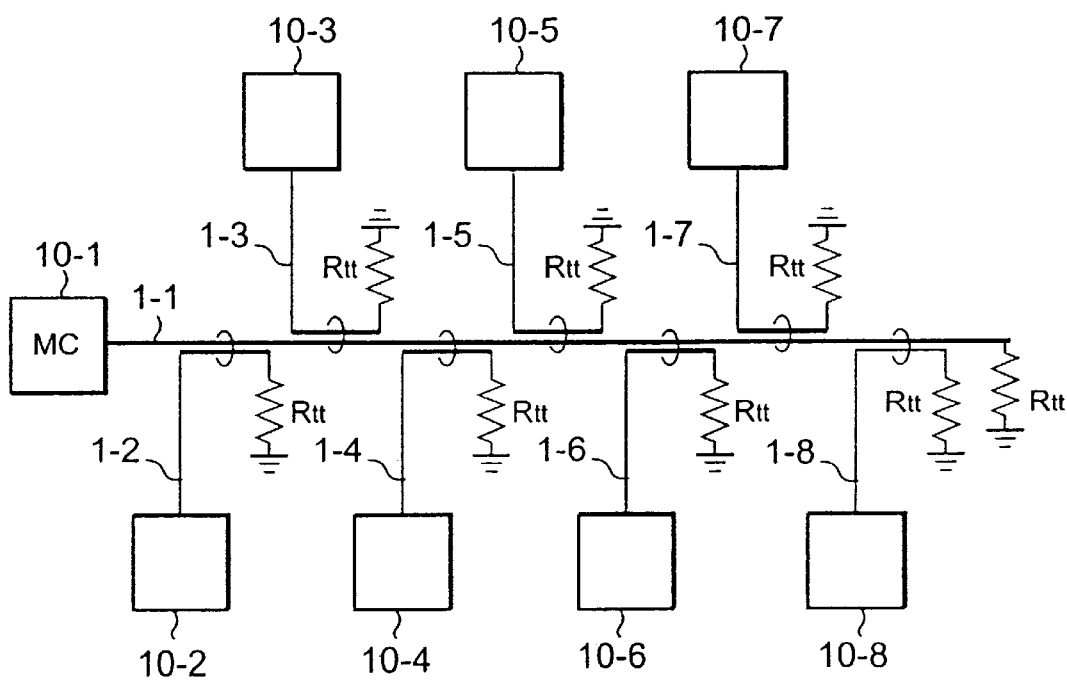
FIG. 3 is a view showing the conventional technique.

As shown in FIG. 3, the conventional technique of U.S. Pat. No. 5,638,402 has the problem that the interval (pitch) of the memory modules 2-2–2-4 mounted on the mother board 1-1 can not be smaller than the length of each coupler, since the directional couplers are serially arranged.

However, as shown in FIG. 1, by arranging the coupler within the memory module 2-2, the intervals (pitch) of the memory modules 2-2–2-4 mounted on the mother board 1 can be set irrespective of the length of the coupler, thus permitting high-density mounting in the system.

Further, it is possible to reduce a layer for signal lines in the mother board 1, and thus to reduce the cost of the mother board.

In the present embodiment, the number of the memory modules is three, i.e., the modules 2-2–2-4. However, the number of the modules may be less than or more than three, depending on requirements of the system.

Now, a second embodiment will be described referring to FIG. 4.

In the present embodiment, a transceiver for a directional coupler is provided as a separate part in a memory module, thus further increasing the capacity of memory mounted in a memory module.

A memory controller (hereinafter referred to MC) 10-1 is an LSI chip having a control function as a memory controller. Memory modules 2-2–2-9 are each mounted with a plurality of memory chips 10-2–10-9. A printed circuit board called a mother board 1 is mounted with MC 10-1 and the memory modules 2-2–2-9, and has lines that transfer data between MC 10-1 and the memory chips 10-2–10-9 within the memory modules 2-2–2-9. The mother board 1 is formed with directional couplers C2–C9, and these couplers are formed by the main line 1-1 and the lines 1-2–1-9. In the memory modules 2-2–2-9, the lines 1-2–1-9 from the mother board 1 are wired to the transceivers 3-2–3-9 through connectors, respectively.

Each of the transceivers 3-1–3-9 comprises a driver 6-2 and a receiver 5-1, and has a directional control function for performing output control of two kinds of buffers 6-2 (included in the driver) and 5-1 (included in the receiver). In FIG. 4, the buffer 6-2 is shown by a triangle and the buffer 5-1 is shown by a triangle having the base of a double line.

The directional couplers C2–C9 generate crosstalk in accordance with a drive pulse.

The buffer 6-2 receives an NRZ (Non Return to Zero) signal that is an ordinary digital signal (a rectangular pulse) as input, and outputs this as the NRZ signal. The buffer 5-1 demodulates an RTZ (Return to Zero) signal, which is converted from an NRZ signal by a directional coupler C2–C9, into an NRZ signal as an original digital signal. Namely, the buffer 5-1 converts an RTZ signal into an NRZ signal.

A memory module 2-1 comprises the memory controller 10-1 and a transceiver 3-1. Each of the memory modules 2-2–2-9 is mounted with a plurality of memory chips, and these memory modules 2-2–2-9 are arranged on the mother board 1 through the connectors.

The main line 1-1 is wired from the transceiver 3-1, constitutes the directional couplers, and is terminated for impedance matching being connected to a terminating voltage Vtt at the other end. In the directional couplers C2–C9, lines drawn from the transceivers 3-2–3-9 within the memory modules 2-2–2-9 are combined with the main line 1-1 to constitute the couplers. Similarly to the main line 1-1, these lines are terminated for impedance matching being connected to the terminating voltage Vtt. The main line 1-1 may be folded within the modules to form parallel couplers, as in the case of FIG. 1.

The lines 20-2–20-9 within the memory modules 2-2–2-9 connect the respective transceivers 3-2–3-9 with the memory chips. In the embodiment of FIG. 1, since the signal level generated in the directional coupler is small and many chips can not be connected, one directional coupler is connected to only one chip. In other words, in the embodiment of FIG. 1, when many chips are mounted, the input capacitance of the chips becomes larger, and the RTZ signal level becomes lower. Further, since branches for wiring arise, reflection distortion becomes larger. From those reasons, the above-mentioned problem is caused. On the other hand, in the present embodiment, even when many memory chips are connected through the transceivers 3-2–3-9, the lines 20-3–20-9 are demodulated into NRZ signals having a larger signal amplitude, so that each memory chip can be driven fast. Thus, in the present embodiment, it is possible to realize multiple bank structure in which a number of connected memory chips for each signal is increased.

MC 10-1 sends the transceivers 3-1–3-9 a read/write (R/W) signal that controls the signal transfer direction, depending on a state of read or write of the memory. This read/write signal may be used also as a read/write signal for the memory chips. In FIG. 4, the read/write signal R/W is connected to all the chips. Considering the fan-out of the driver of MC 10-1 and the operation frequency of the R/W signal, a transceiver may be added when the fan-out is large. In the present embodiment, the operation frequency of the transceiver is low, and accordingly, the transfer from NRZ to NRZ is sufficient.

When MC 10-1 writes data into a memory chip (write operation), the following operation is performed.

First, MC 10-1 sets the R/W signal into a write mode, enables the buffer 6-2 within the transceiver 3-1, and disables the buffer 5-1. Conversely, the buffers 6-2 built in the transceivers 3-2–3-9 within the memory modules 2-2–2-9 are disabled, and the buffers 5-1 built in the transceivers 3-2–3-9 are enabled. This operation makes preparation for writing from MC 10-1 to each memory.

After bank RAS (Row Address Strobe)/CAS (Column Address Strobe) address is sent to prepare for the writing, MC 10-1 sends digital (NRZ) data. The sent NRZ signal is converted to an RTZ signal in the couplers C2–C9, and transmitted to the transceivers 3-2–3-9 within the memory modules 2-2–2-9. The transmitted RTZ signal is demodulated from the RTZ signal to the NTZ signal in the respective buffers 5-1 within the transceivers 3-2–3-9, and the data is transferred to the memory chip through the buses 20-2–20-9. Writing the data into the memory, the write operation is completed.

On the other hand, when data is read into MC 10-1 (read operation), the following operation is performed.

First, MC 10-1 sets the R/W signal into a read mode, enables the buffer 5-1 within the transceiver 3-1, and disables the buffer 6-2 within the transceiver 3-1. Conversely, the buffers 5-1 built in the transceivers 3-2–3-9 within the memory modules 2-2–2-9 are disabled, and the buffers 6-2 built in the transceivers 3-2–3-9 are enabled. This operation makes preparation for reading from each memory to MC 10-1.

The memory selected by a conventional chip select (CS) signal (not shown) receives a conventional bank RAS/CAS address (not shown) to prepare for the read data operation, and thereafter, the selected memory sends an NRZ signal as a rectangular wave. The transmitted NRZ signal is sent as the NRZ signal itself through the buffer 6-2 of the transceiver 3-2–3-9, and converted into an RTZ signal in the coupler C2–C9. This RTZ signal is propagated through the main line 1-1 toward MC 10-1. The transmitted RTZ signal is demodulated from the RTZ signal to the NRZ signal in the buffer 5-1 within the transceiver 3-1, and transmitted to MC 10-1. When MC 10-1 reads this data, the read operation is completed.

Here, the transceiver 3-2–3-9 may generate not only the RAN signal but also the CS signal in combination with the R/W signal. Namely, since the CS signal is generated for the memory for which read access is carried out, it is not necessary to enable transceivers of other memories than the memory to be accessed. Thus, it is sufficient that the directional control is performed only for the memory as an object of the read access or the transceiver of the memory module that mounts the memory in question, holding the other transceivers disabled. Of course, at the time of writing; similar operation can be carried out. This goes without access signals for the other memories than the object memory, and accordingly, power consumption can be reduced.

Here, of course, the address and the read/write state are determined previous to the read/write operation.

Thus, since the memory controller module contains the transceiver 3-1, and the transceiver 3-1 is combined with the directional couplers C2–C9, low-distortion and high-speed data transfer can be performed. Accordingly, MC 10-1 can send and receive all the signals in the NRZ form at a high speed. Thus, it is not necessary to provide the receiver with a special circuit for demodulating an RTZ signal, and it is possible to connect a memory controller that has only a drive receiver for transfer of an NRZ signal. Further, since the memory controller is provided in a form of a module, it is also possible to connect a memory controller provided with an RTZ receiver that can be directly connected to the main line 1-1. This makes the system structure flexible.

Further, since the transceivers 3-2–3-9 are provided within the memory modules, the transceivers 3-2–3-9 are combined with the directional couplers C2–C9, so that data can be transferred to and from MC 10-1 with low distortion and high speed. Further, according to the structure of the present embodiment, only by providing a memory chip with an interface for a conventional NRZ signal only, many chips can be connected. Further, the data bus inside the memory module 2-2 is generally shorter in comparison with the main line 1-1, so that high-speed operation can be realized. For transfer between memory modules with larger wiring distance between them, an NRZ signal is converted to an RTZ signal by a directional coupler to transfer the signal. On the other hand, within a memory module having shorter wiring length, a signal is transferred in the form of an NRZ signal. Thus, using the different transfer methods, high-speed operation can be realized in both cases, and costs and performance can be compatible in the system.

Further, even when an LSI designed for RTZ (Return To Zero) signal transmission using a directional coupler and an LSI designed for NRZ (Non Return To Zero) are arranged on a same bus, it is possible to realize compatibility on the level of signals by selectively using a transceiver.

Thus, according to the present embodiment, many memory chips can be mounted in a memory module, so that mass storage and high-density memory system can be realized.

Next, referring to FIG. 5, a third embodiment will be described.

As describe above, there is a problem that, in high-speed data transfer, as the transfer speed increases, waveform distortion increases owing to the frequency-dependent effects such as the skin effect. As a technique overcoming this problem, there is a technique in which pulse waveform is sharpened at the time of transition (rise and fall). However, that technique is complex in the structure and control of the driver. Thus, an object of the present embodiment is to perform such shaping of the pulse waveform using not a driver but a coupler.

Figure 5:
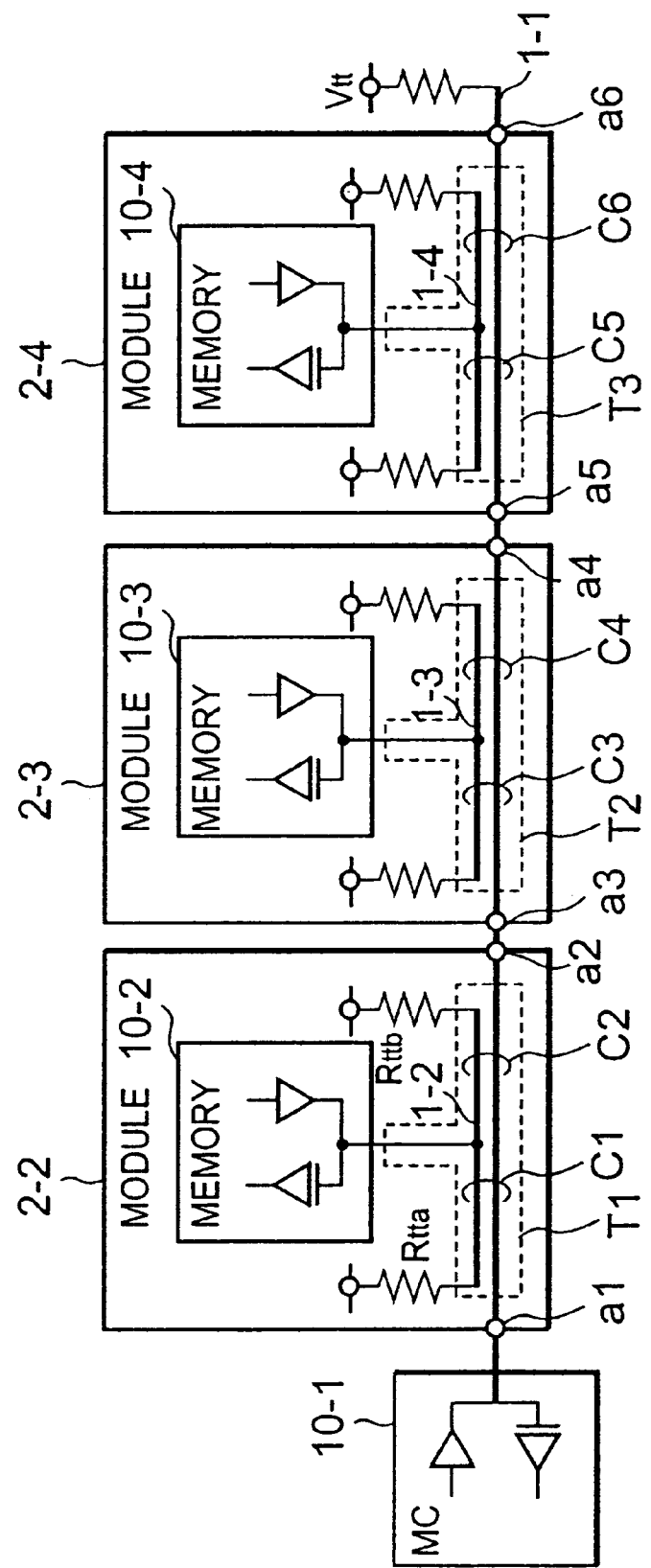
FIG. 5 shows a memory module bus using T-shaped directional couplers for compensation of dulling of waveform owing to the skin effect etc., according to a third embodiment.

FIG. 5 shows a memory bus connecting MC 10-1 and memory chips 10-2–10-4 that send and receive data signal. The main line 1-$i$ from MC 10-$i$ and a leader line 1-2 from a memory 10-2 mounted on a memory module 2-2 constitute a T5 shaped directional coupler T1. As described later, the T-shaped directional coupler T1 has a function of sharpening the waveform at the time of the transition. T-shaped couplers T2 and T3 have the same function.

In memory modules 2-2–2-4, both ends of each T10 shaped line 1-2, 1-3 or 1-4 are terminated. Further, within the module 2-2, the main line i-i is wired from a terminal a1 to a terminal a2 without a branch. On a mother board not shown in FIG. 5, the main line 1-1 is connected from the terminal a2 to an terminal a3 on the memory module 2-3. Similarly passing through terminals a4, a5 and a6 in the modules 2-3 and 2-4, the main line 1-1 is finally terminated.

Operation principle of this T-shaped coupler will be described referring to FIGS. 6 and 7.

Figure 6:
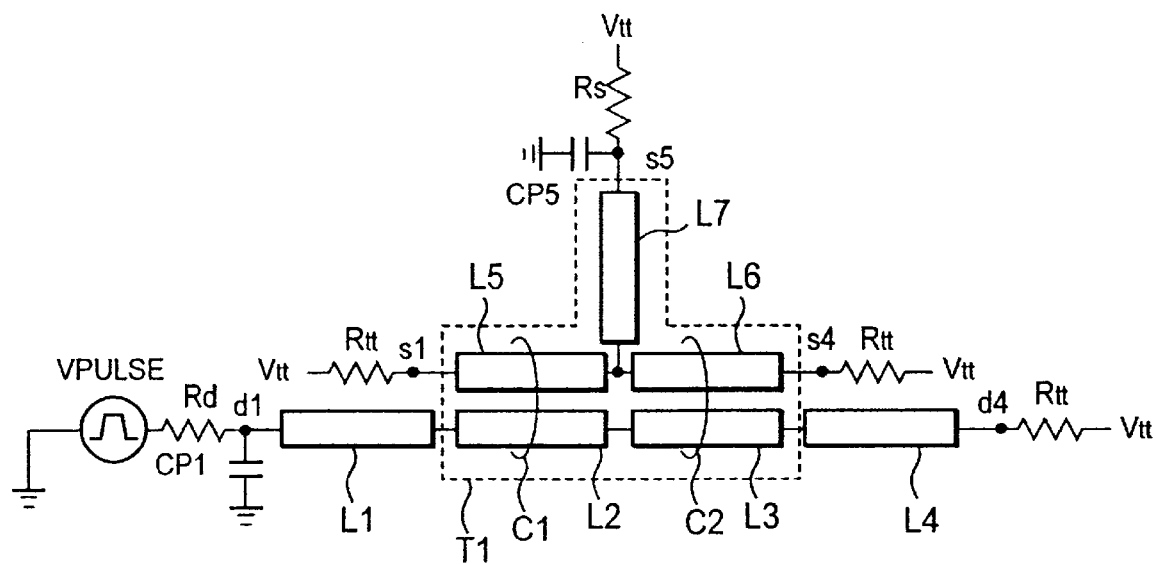
FIG. 6 is a view for explaining write operation in the third embodiment.
Figure 7:
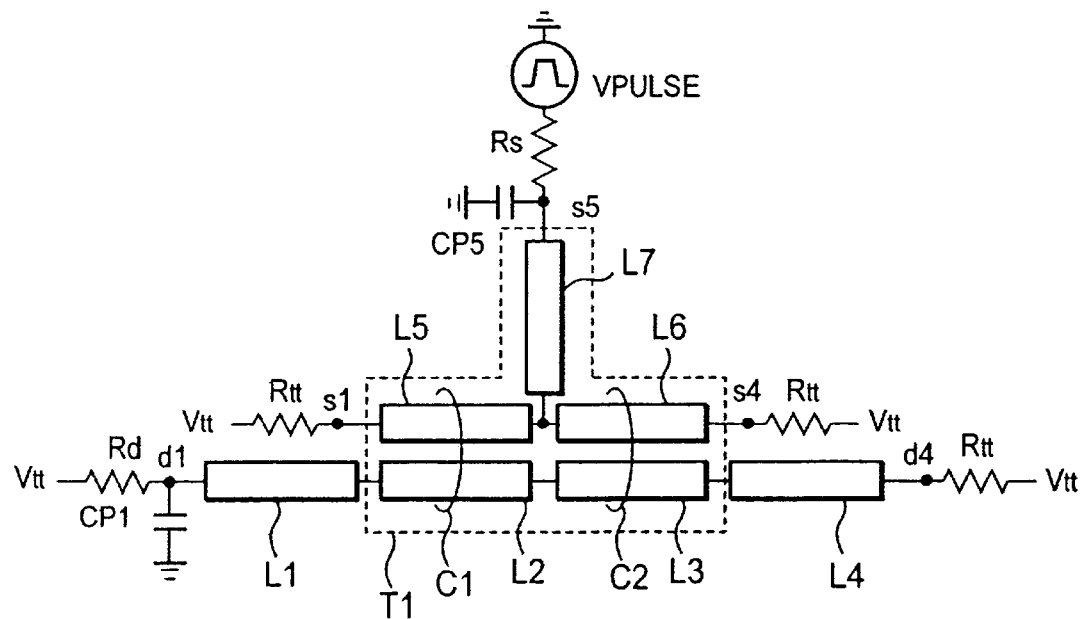
FIG. 7 is a view for explaining read operation in the third embodiment.

FIG. 6 is an explanatory view for write operation in FIG. 5, and FIG. 7 is an explanatory view for read operation.

Empty boxes shown in FIGS. 6 and 7 express transmission paths. A line corresponding to the main line 1-1 comprises transmission lines L1, L2, L3 and L4, and a line corresponding to the line 1-2 comprises transmission lines L5, L6 and L7. The transmission lines L2 and L5 form a coupler C1, and the transmission lines L3 and L6 form a coupler C2.

The T-shaped coupler T1 shown in a dotted line comprises the two couplers C1 and C2 connected to each other and the transmission leader line L7 from them. Each terminal of the coupler T1 is connected to the terminating voltage Vtt through a terminating resistance rtt, in order to clarify the naked and true electric characteristics of the coupler. By this arrangement, there is no reflection at each point in the transmission path.

In write operation, the driver of MC 10-1 in FIG. 5 is expressed by an equivalent circuit comprising a pulse source (vpulse), its internal resistance rd, and capacitance Cp1 of MC 10-1, in FIG. 6. Further, the receiver of the memory 10-2 of Fig. S is expressed by capacitance Cp5 and resistance rs connected to a node s5 in FIG. 6. Further, in read operation, the receiver of MC 10-1 is expressed by the capacitance Cp1 and resistance rd connected to a node d1, in FIG. 7, and the driver of the memory 10-2 is expressed by pulse source, its internal resistance rs, and equivalent capacitance Cp5.

Circuit simulation was carried out in order to clarify the characteristics of the T-shaped coupler shown in FIGS. 6 and 7.

Figure 8:
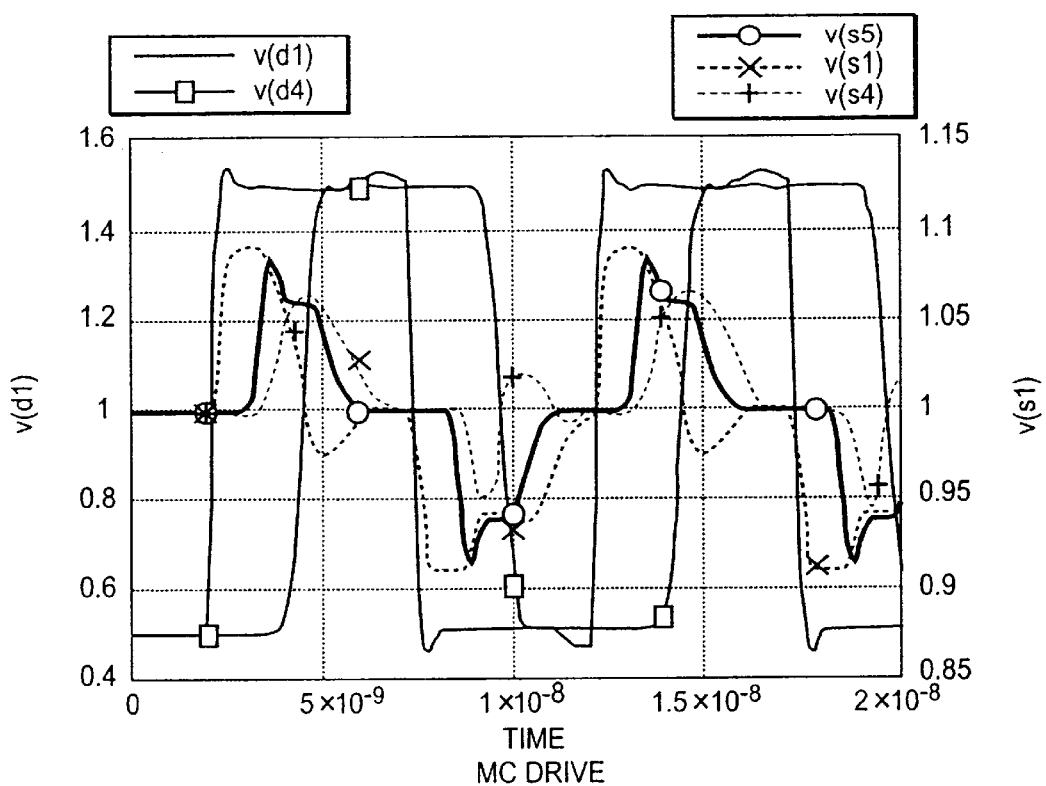
FIG. 8 is a view showing simulation waveforms.
Figure 9:
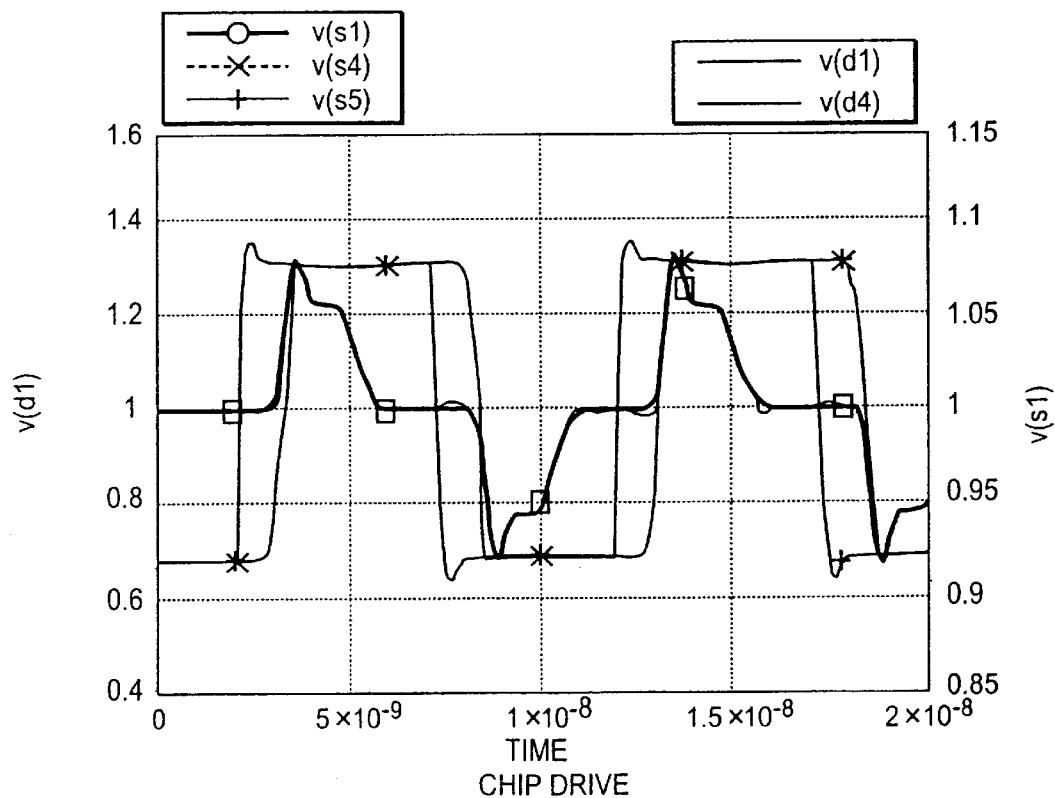
FIG. 9 is a view showing simulation waveforms.

Waveforms for various points are shown in FIGS. 8 and 9.

The circuit simulation was carried out using SPICE (Simulation Program for Integrated Circuit Emphasis). However, SPICE employed can not deal with the skin effect, and accordingly, a state without dull waveform was simulated. In fact, the skin effect is superimposed on this simulation effect. As a result, generally, shoulders of the waveform become attenuated or dull.

FIG. 8 shows waveforms at various points (d1, d4, s1, s4 and s5) in the read operation corresponding to FIG. 6, and FIG. 9 shows waveforms at those points (d1, d4, s1, s4 and s5) in the write operation corresponding to FIG. 7. FIG. 8 and FIG. 9 are different from each other only in position of a driver, with the other constants of the circuit being same.

In FIG. 8, the position of the driver is the node d1 in FIG. 6. Observation points for waveforms are the drive point d1, the termination point d4 of the main line 1-1, the input terminal s5 for rs, and both terminations s1 and s4 of the coupler.

The respective values of the parameters are shown in the following.

| | |
|---|---|
| Terminating resistance | rtt = 50 [Ω] |
| Capacitance of equivalent input | c1 = 3 [pF] |
| Capacitance of equivalent input | c5 = 3 [pF] |
| Terminating supply voltage | vtt = 1.0 [V] |
| Internal impedance at the point s5 | rs = 50 [Ω] |
| Internal impedance of vpulse | rd = 50 [Ω] |
| Transition time | tr = 0.2 [ns] |
| Propagation delay for the leader line 1-1 | (L2) of the main line 1-1 tpd2 = 360 [ps] |
| Propagation delay for the leader line shaped line 1-2 | (L7) for the T-shaped line tpd5 = 216 [ps] |
| Impedance of the line (L1) of the main line 1-1 | z1 = 50 [Ω] |
| Impedance of the line (L2) of the main line 1-1 | z2 = 59 [Ω] |
| Impedance of the leader line (L7) of the T-shaped line 1-2 | z5 = 25 [Ω] |

The model parameters of the couplers (coupler 1 and coupler 2) are shown in the following.

| | |
|---|---|
| R11 = 1 m [Ω/m] | L11 = 361.3 n [H/m] |
| r22 = 1 m [W/m] L22 = 361.3n [H/m] | L12 = 050 n [H/m] |
| cr1 = 144.5 p [F/m] | |
| cr2 = 144.5 p [F/m] | |
| c12 = 40 p [F/m] | | where r11 and r22 are line resistances per unit length, L11 and L22 self-inductances per unit length of the lines, CR1 and CR2 self-capacitances per unit length of the lines, and line L12 and C12 respectively mutual inductance and mutual capacitance per unit length of the lines.

In FIG. 8, the node d1 shows transmission signal waveform, the node d4 waveform at the position of the terminating resistance of the main line 1-1, and s1, s4 and s5 waveforms at various points in the T-shaped coupler T1. In FIG. 8, a received waveform is shown as the waveform of a heavy solid line of s5, seen as a sharp waveform that becomes steeper at the transition times. This waveform can be used to equalize attenuation at shoulders of signal waveform owing to the skin effect etc.

Similarly, FIG. 9 shows waveforms of read operation corresponding to FIG. 7. Transmission waveform from the node s5 is a rectangular waveform of NRZ, and waveform of the receiving node d1 is a sharp waveform that becomes steeper at the transition times, similarly to FIG. 8. This waveform can be used to equalize attenuation at shoulders of signal waveform owing to the skin effect.

Next, the reason that waveform can be sharpened will be described referring to FIGS. 10 and 11.

FIG. 10(1) shows write data waveform, for example waveform of an NRZ signal from vpulse of FIG. 6 or from MC 10-1 of FIG. 5. It is assumed that this signal propagates through the main line 1-1, and, after the elapse of time T1, arrives at a point on the main line 1-1 corresponding to a junction (a branch point) between the couplers C1 and C2. A signal generated in the coupler C1 at this arrival time has the waveform shown in FIG. 10(2). This waveform is generated as forward crosstalk (FWXT) in the case that the coupler C1 is micro strip line (MSL). The waveform shown in FIG. 10(2) has pulse width comparable to a rise time (Ta) of the output waveform of MC 10-1. FWXT of FIG. 10(2) has a property of running alongside the pulse that propagates through the main line 1-1, and is generated as crosstalk at a junction between the transmission lines L5 and L6 as a branch point in the line 1-2, just when the pulse arrives at a junction between the transmission lines L2 and L3 on the main line 1-1. Here, in the case that the coupler is strip line (SL), the coupling coefficient is zero, and accordingly FWXT is not generated.

Further, the NRZ signal on the main line 1-1 propagates without reflection on the transmission line L3 toward the termination. This propagation pulse generates backward crosstalk (BWXT) in the coupler C2. This crosstalk waveform is shown in FIG. 10(3). This crosstalk waveform endures for duration of round-trip propagation in the line length of the coupler C2.

In detail, in the case that the coupler is formed in a glass epoxy type printed circuit board, its relative dielectric constant is about $\epsilon r=4.6$. Thus, in the case that the coupling length is 30 [mm], multiplication by the propagation velocity of the pulse 7.15 [ps/mm]

$(=\sqrt{(\text{relative dielectric cons tan }t=4.6)}/\text{velocity of light})$ leads to a round-trip propagation delay 429 [ps].

At the branch point in the line 1-2 in FIG. 5, the forward crosstalk generated in the coupler C1 and the backward crosstalk generated in the coupler C3 are superimposed. The superimposed waveform is shown in FIG. 10(4). This superimposed waveform propagates to the memory chip 10-2 of FIG. 5.

The skin effect is a phenomenon that shoulders of waveform become dull, and sharpening of the rise of the pulse by overshoot serves to eliminate this dulling of waveform. The waveform shown in FIG. 10(4) is just like that.

FIG. 10 shows waveforms relating to the data transfer from MC 10-1 to the chip 10-2 in FIG. 5. Similarly, the same waveforms are generated with respect to data transfer from the chip 10-2 to MC 10-1. This will be described referring to FIG. 11.

FIG. 11(1) shows an NRZ signal from the chip 10-2. After this signal arrives at the branch point in the line 1-2, it proceeds both toward the coupler C1 (L5) and toward the coupler C2 (L6). Thereafter, the waveform generation process shown in FIG. 10 occurs in the reverse direction. FIG. 11(2) shows voltage waveform on the side of MC 10-1, i.e., at the node d1 of FIG. 7. Here, FWXT generated in the coupler C1 runs alongside the pulse waveform that transmits through the transmission line L5, and proceeds through the transmission line L2 while increasing the pulse amplitude. On the other hand, BWXT generated in the coupler C2 is generated at the same time when the pulse inputted into the branch point of the line 1-2, and the generated BWXT proceeds through the transmission line L2. This pulse width is the same time Tb as the time shown in FIG. 10. These forward crosstalk generated in the coupler C1 and backward crosstalk generated in the coupler C2 proceed through the transmission line L2 at the same time, and result in the waveform shown in FIG. 11(2). The waveform shown in FIG. 11(2) is same as the waveform of FIG. 10(4) in the case of the drive by MC 10-1. On the other hand, the waveform on the side of the node d4 of FIG. 7 is shown in FIG. 11(3). The waveform of FIG. 11(3) is same as FIG. 11(2) except for its arrival time. This is because BWXT and FWXT generated in the main line 1-1 are generated respectively by the couplers C2 and C1 inversely to the crosstalk toward MC 10-1 in a same generation process.

As described above, when the T-shaped coupler is used, although an edge rises sharply (overshoot) only at a transition time, the pulse width is the same as the case in which only the coupler C2 is used. Thus, the pulse width is not increased. In other words, also the T-shaped coupler can be used to equalize dull waveform owing to the skin effect, and at the same time, can maintain the same pulse width as in the case of using the coupler C2 only. Accordingly, the high-speed operation is not retarded.

The overshoot part is generated by FWXT, and accordingly, micro strip line should be selected for the coupler. Further, even in FWXT, its forward crosstalk coefficient may be positive or negative depending on the structure of the board. Thus, it is important to select the wiring structure of the board such that the forward crosstalk coefficient becomes positive.

According to thus-described operation, in the memory system of FIG. 5, dulling of waveform owing to the skin effect can be equalized by overshoot generated in the T-shaped coupler T1–T3 between MC 10-1 and the memory chip 10-2–10-4, so that an improved high-speed system can be realized.

Next, a fourth embodiment will be described referring to FIG. 12.

An object of the present embodiment is to simplify design of data fetch timing that is indispensable for high-speed data transfer, in addition to high-density mounting of memory according to the first embodiment.

A memory controller (MC) 10-1 sends and receives a read signal, a write signal, and a clock signal to and from memory chips 10-2–10-5. A main line 7-1 is for the clock signal. T-shaped couplers 7-2–7-5 coupled to the main line 7-1 are connected to the memory chips 10-2–10-5, respectively, and both ends of each T-shaped coupler are terminated for impedance matching.

A clock signal CLKout is outputted from MC 10-1 synchronously with a clock phase φ within the MC 10-1, passes through the main line 7-1, and is inputted again to a clock input signal CLKin. The main line 7-1 is terminated at both ends in the neighborhood of MC 10-1, and there hardly exists any reflection at those ends.

Further, a read/write data signal is outputted from, MC 10-1, and a switch 9 connects the data signal to Write direction at the time of write operation and to Read direction at the time of read operation, with lower impedance. Write and read signal terminals of the switch 9 are connected to a main line 8-1 for data, and the main line 8-1 for data is terminated at both ends. Similarly to the clock signal, a data signal is coupled to memory chips 10-2–10-5 through T-shaped couplers 8-2–8-5, respectively.

Figure 12:
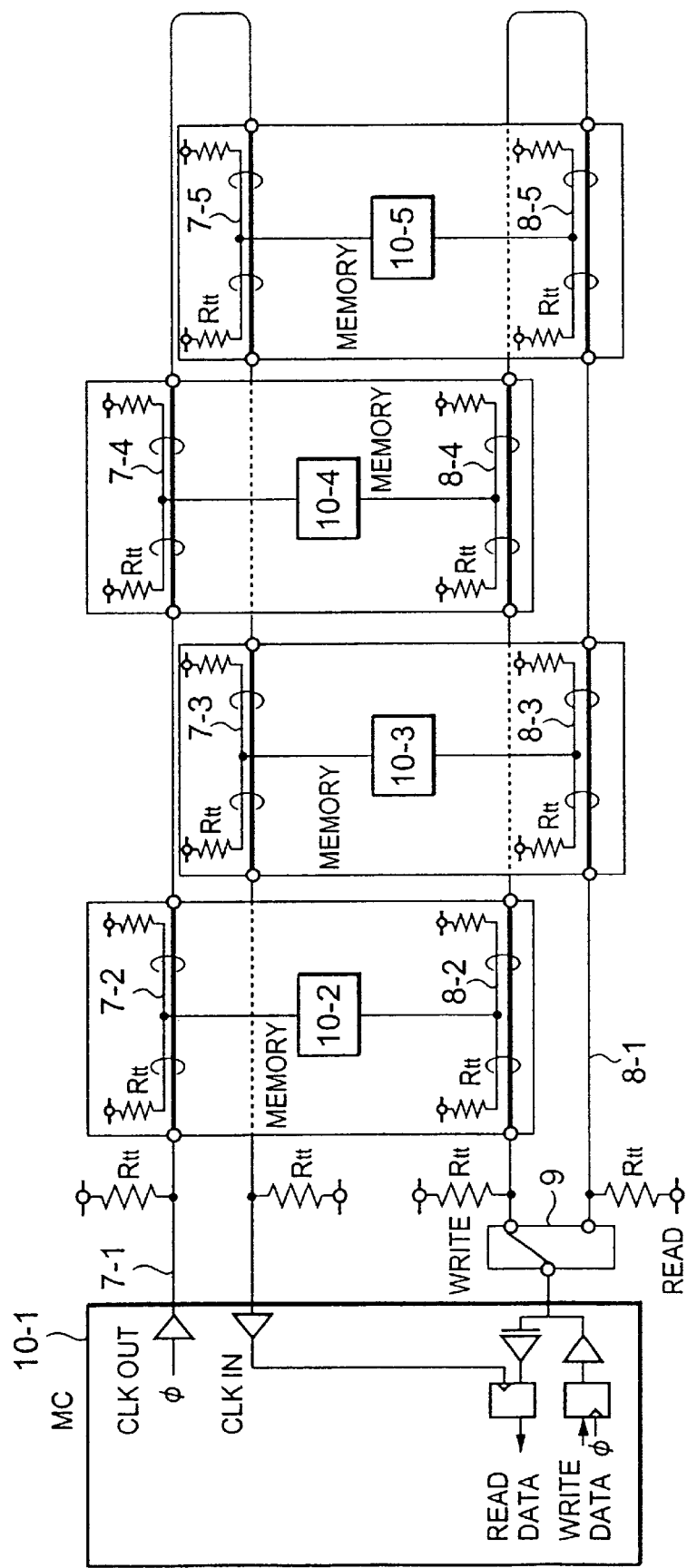
FIG. 12 shows a memory module system in which folded lines and the T-shaped couplers are used.

Here, FIG. 12 shows only the CLK signal and data signal. For other signals that are only written into the chips, such as an address signal, a control signal, and a chip select signal, a switching device such as the switch 9 is not necessary.

When data is written from MC 10-1 (write operation), the following operation is carried out.

First, MC 10-1 is switched to the Write side by controlling the switch 9. This makes preparation for writing from MC 10-1 to each memory. After sending bank RAS/CAS address to prepare for writing, MC 10-1 sends NRZ write data synchronously with the clock φ.

The above-mentioned two' main lines are arranged and wired such that the sent NRZ signals, i.e., the clock signal and the write data signal are' converted to RTZ signals in respective T-shaped couplers, and these RTZ signals are transmitted in phase, to the memory chips 10-2–10-5. Here, "phase" means a time difference between waveforms of the clock signal and the data signal, and "in phase" means that a difference between arrival times of the signals is so small that it can be neglected in the read/write operation.

To realize the arrangement and wiring for in-phase transmission of the signals, both the main line 7-1 for the clock signal and the main line 8-1 for the data signal are folded in the same shape. With respect to these folded lines, respective sets of T-shaped couplers 7-2–7-5 and 8-2–8-5 are formed so as to have the same propagation delays with respect to MC 10-1.

For example, with respect to the chip 10-2 closest to MC 10-2, although the propagation delay is short for each of clock signal and data signal, both clock signal and data signal have the same propagation delay, so that their phase difference can be neglected. Similarly, with respect to the chip 10-3 having the largest propagation time from MC 10-1, the clock signal and data signal has the same propagation delay, so that their phase difference can be neglected, also.

Since the clock signal and the write data signal are inputted in phase into the memory chips 10-2–10-5, the memories 10-2–10-5 can use the clock signal to latch data. By this, data is written into a memory, thus completing the write operation.

When MC 10-1 reads data (read operation), the following operation is carried out.

First, MC 10-1 sets the R/W signal to a read mode. After sending bank RAS/CAS address to prepare for reading, digital (NRZ) read data is sent from the addressed memory, synchronously with the clock signal. The clock signal passes through the folded main line 7-1 and is inputted again into MC 10-1. As a read data signal, an RTZ signal is transmitted into the main line 8-1 through a T-shaped coupler. At this time, as shown in FIGS. 9 and 11, on the main line side of the T-shaped coupler, the same waveform is generated on both sides. Those generated RTZ signals propagate in both clockwise and anti-clockwise directions of the main line. Since the switch 9 is turned to the read side, the clockwise RTZ signal is transmitted to MC 10-1. In that case, the phase difference between the data signal and the clock signal is same for any memory chip 10-2–10-9.

The signals become in phase with each other since the main line 7-1 of the clock signal and the main line 8-1 of the data signal are folded in the same way, and the sets of the T-shaped couplers 7-2–7-5 and 8-2–8-5 are arranged for the respective main lines such that they have the same propagation delays with respect to MC 10-1. In other words, in the case that a memory is located in a position of a shorter arrival time from MC 10-1, the read data is sent in earlier time and the propagation delay on the main line 8-1 is longer. As a result, the time when the data from this memory arrives at MC 10-1 is almost same as the time when the clock signal outputted from MC 10-1 propagates and returns to MC 10-1. On the other hand, in the case that a memory is located in a position of longer arrival time from MC 10-1, the read data is sent in later time and the propagation delay on the main line 8-1 is shorter. In this case too, the time when the data from this memory arrives at MC 10-1 is almost same as the time when the clock signal outputted from MC 10-1 propagates and returns to MC 10-1. Namely, both in the case of shorter propagation delay and in the case of longer propagation delay with respect to MC 10-1, read data from a memory chip arrives at MC 10-1 at the same time. Thus, when the returned clock signal CLKin is used within MC 10-1, read data from a memory chip at any position can be latched in phase with the clock signal. By this, design relating to data timing becomes remarkably easy.

The read data signal from a memory chip 10-2–10-9 is inputted into MC 10-1 with the same phase difference as the clock signal sent from and inputted again into MC 10-1. Thus, MC 10-1 can latches the data using the clock signal (CLKin signal). By this, the data from the memory is read, thus completing the read operation.

Large factors in realizing the above-described operation are realization of a function of transmitting a signal without turbulence of impedance, owing to the directional couplers 7-2–7-5 and 8-2–8-5, and realization of a function of sending the same pulses both forward and backward, owing to the T-shaped coupler. In other words, only the L-shaped couplers C1 and C2 can not realize thus-described phasing.

According to the above-mentioned two functions: even when directional couplers are used, the folded wiring and read/write signal switching can synchronize write and read of data in the memory system so as to realize high-speed operation; the directional coupler formed within a memory module can realize high-density mounting; and, since the use of the T-shaped coupler can sharpen the pulse in a transition time, it is possible to cope with waveform distortion such as the skin effect, and to realize high-speed operation.

Next, another application example of the present embodiment will be described referring to FIG. 13.

Figure 13:
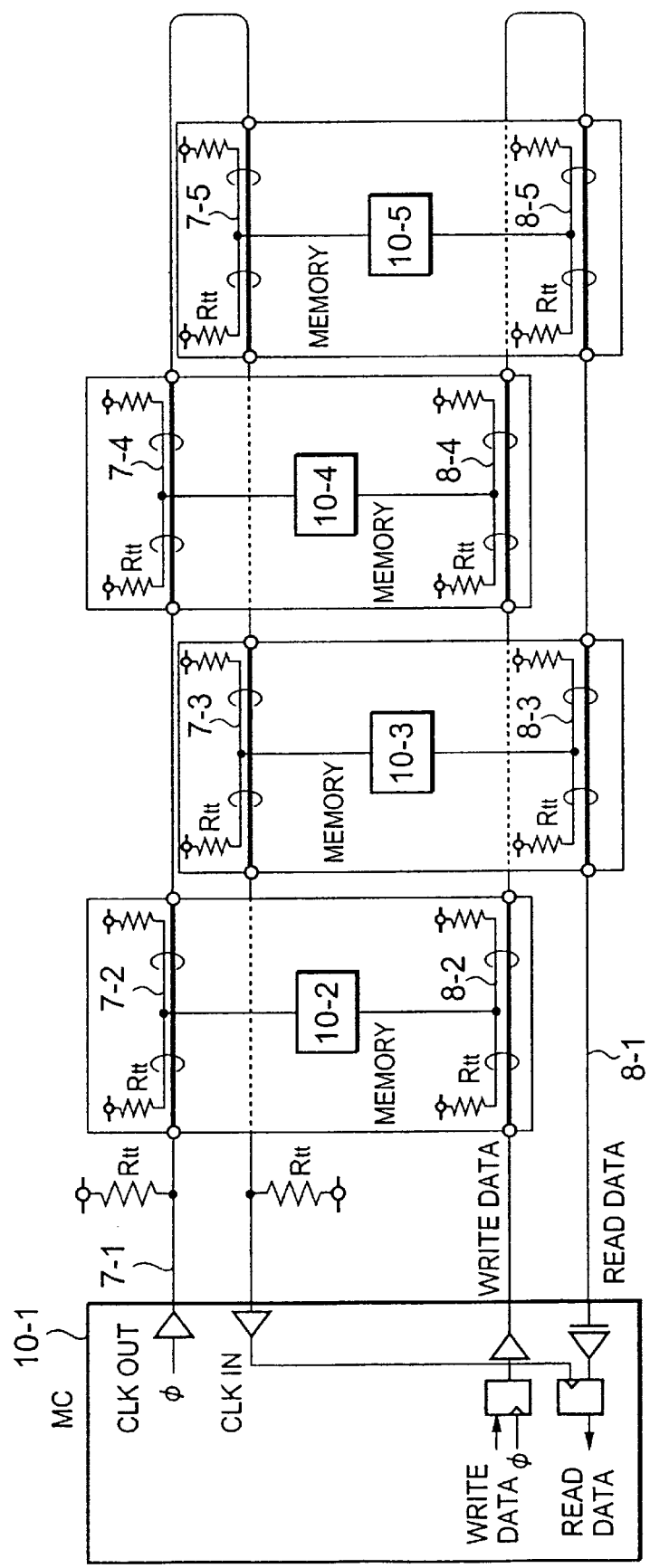
FIG. 13 shows a memory module system in which folded lines and the T-shaped couplers are used.

FIG. 13 is different from FIG. 12 in the data signal circuit of MC 10-1. FIG. 13 shows an embodiment in which an interface circuit for write data and an interface circuit for read data are separated, each circuit having a driver and a receiver. In FIG. 13, a driver for sending write data and a receiver for receiving read data have the same internal impedance as the characteristic impedance Zo of the main line 8-1, so that there is no reflected signal wave at the terminals of MC 10-1. According to the structure of FIG. 13, similarly to FIG. 12, read/write data can be synchronized, pulse transition can be sharpened, and high-density mounting can be realized. In addition, the terminating resistance for data and the switch 9 can be dispensed with, so that a lower price can be realized.

Next, another embodiment using T-shaped couplers will be described, referring to FIG. 14.

The present embodiment is different from the embodiment of FIG. 13 in that, instead of the CLK signal, a strobe signal (DQS) is used to perform data sending and receiving.

The DOS signal is sent synchronously with the internal clock signal φ of MC 10-i, at the time of data writing. Memory chips 10-2–10-5 use this DOS signal for latching write data (DQ signal) generated in a T-shaped coupler 8-2–8-5 coupled to a main line 8-1. Similarly to the previous embodiments, propagation phase difference between the DOS signal and the DO signal is same for any chip 10-2–10-5, and therefore, the mentioned operation is possible.

With respect to read data, read data (DQ) from each chip is inputted into MC 10-1 through the coupler and the main line 8-1. At the same time, also the strobe signal (DQS) is sent from the memory chip that sends the read data. As a result, although the memory chips 10-2–10-5 are arranged such that their delays for MC 10-1 are different, phase difference between read data (DQ) and the strobe signal (DQS) is same for any memory chip. Accordingly, MC 10-1 can latch the read data DO using the DOS signal. In other words, even in the case that wiring is not folded, read data can be synchronously taken in.

Figure 15:
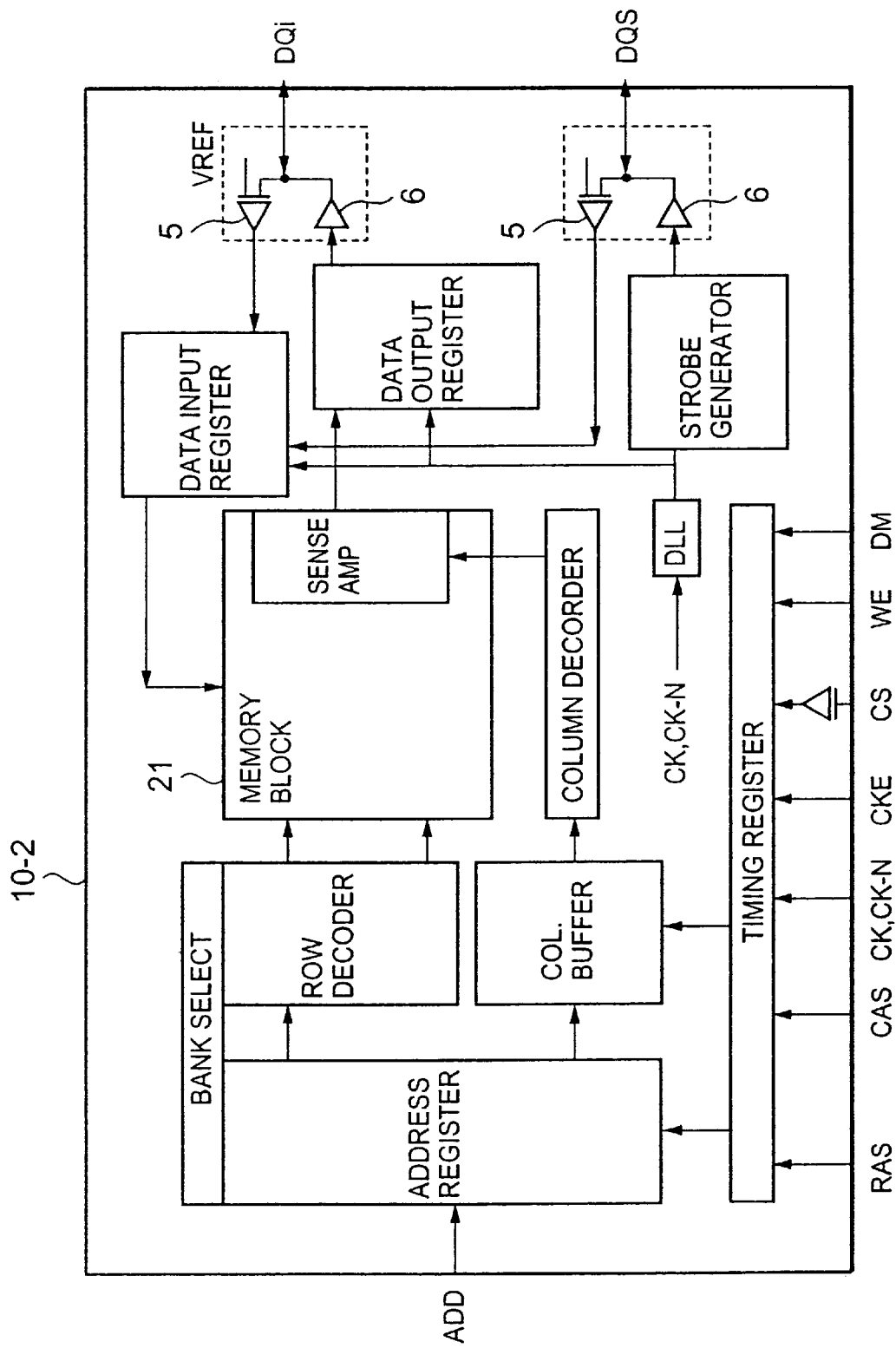
FIG. 15 is a block diagram showing the inside of a memory for directional coupling type transmission.

Next, FIG. 15 is a block diagram showing the inside of a memory chip suitable for data transfer using directional couplers.

In the memory chip shown in FIG. 15, ADD signal, RAS, CAS, and CS signal are used in addressing for storing or reading data from a memory block 21. Data is read through a sense amplifier. The read data is buffered in a data output register, and thereafter outputted through a driver 6. Write data is inputted through a receiver 5, buffered in a data input register, and thereafter stored into the memory block.

The receiver 5 in FIG. 15 could, for example, include a demodulator circuit that converts an RTZ signal to an NRZ signal. Further, a receiver for inputting a conventional NRZ signal is also contained, and providing this as a metal option has the advantage that interfaces to which the memory is adapted are increased at a low cost.

Similarly to the data signal (DQ), with respect to the strobe signal (DQS) also, the receiver is provided with a demodulator circuit that converts an RTZ signal to an NRZ signal.

The other functional blocks are same as an ordinary synchronous DRAM (SDRAM).

According to the structure shown in FIG. 15, even in the signal transmission using directional couplers, an RTZ signal can be demodulated into an NRZ signal, and data can be transmitted at a high speed.

Figure 14:
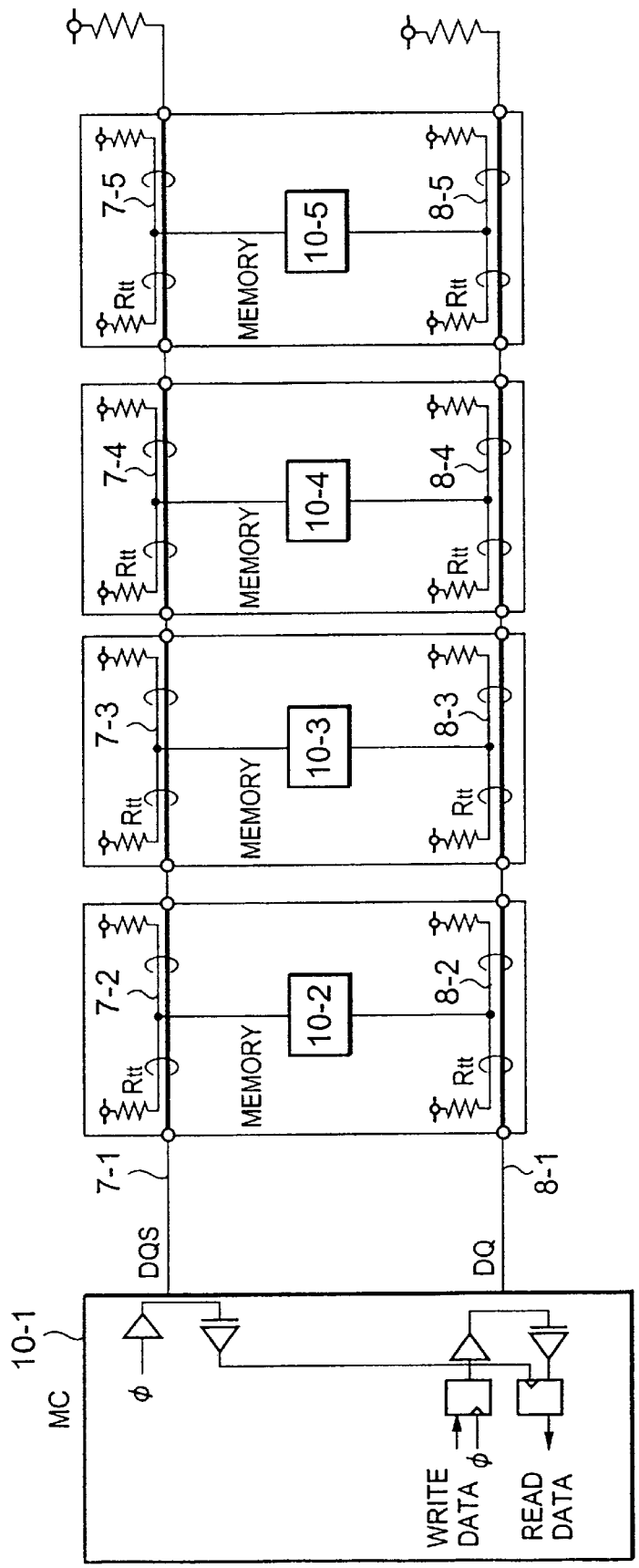
FIG. 14 is a memory module system in which DQS signal and T-shape couplers are used.

There has been a problem that a latency of write data is long in a memory module system using a DQS signal for latching a DQ signal as shown in FIG. 14, or double data rate synchronous DRAM (DDR-SDRAM). Now, this problem will be described referring to FIG. 16.

In SSTL (Stub Series Terminated Logic) interface employed in DDR-SDRAN, an Hiz state is same as the terminating voltage Vtt, and a reference voltage Vref of a receiver is almost same as the terminating voltage Vtt. Accordingly, there has been a problem that a transition from Hiz to an L state, or a transition from Hiz to an H state can not be detected.

Figure 16:
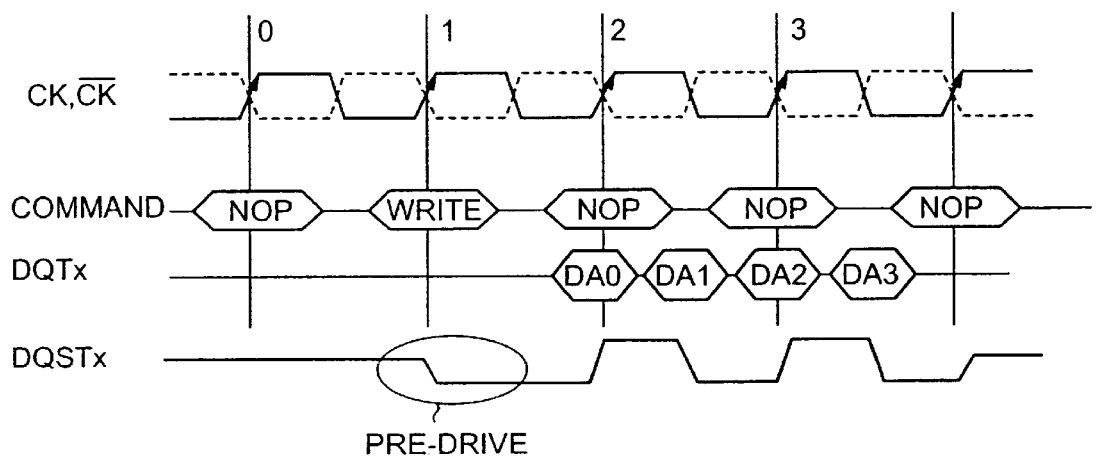
FIG. 16 is a data timing chart for DDR-SDRAN memory transmission.

In FIG. 16, a command is issued and data is sent based on a clock CK. For example, a write command is issued in the stage 1, and write data (DAO) is sent in the stage 2. Namely, a strobe signal DQS is once lowered from an Hiz state to an L state in order to drive a strobe signal for latching the data in the stage 2, thus one cycle of wait intervening.

This is because the memory can not detect a transition of DQS from Hiz to an L state, and can identify a transition of DQS only when DQS rises from L to H. Accordingly, for recognizing a DOS transition, pre-drive, or wait, of one stage is necessary.

Figure 17:
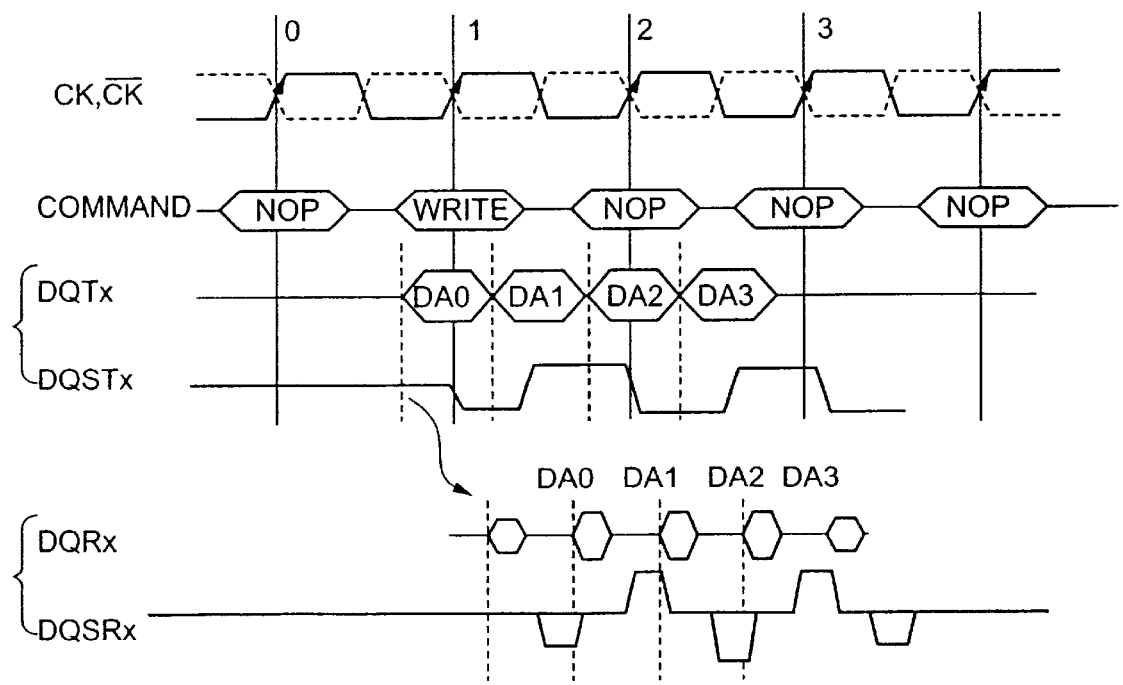
FIG. 17 is a data timing chart for directional coupling type transmission.

On the other hand, when a directional coupler is used as in the present embodiment, data can be issued synchronously with a command as shown in FIG. 17. Here, DQTx is a data signal waveform sent from MC, and DQRx is a data signal waveform that is converted to an RTZ signal by a directional coupler and inputted into an input receiver of a memory chip. Similarly, with respect to a strobe, DQSTX and DQSRx are an output signal of MC and an input signal of the memory chip, respectively.

As seen from FIG. 17, MC issues a write command and data DQTx at the same time. Also, DQSTx is driven in the stage 1. In the case of FIG. 17, although the DQSTx signal falls from an intermediate value of Hiz similarly to FIG. 16, on the side of the memory chip, DQSRx shows a rise pulse from Hiz. Namely, when DQSTx changes from Hiz to L, the DQSRx signal generates a pulse, and the memory chip can identify this pulse. Owing to this, a pre-drive is not required in DQS, and a write command and write data can be issued at the same time. As a result, an access latency for memory write can be shortened by 1 stage. Thus, as the system, since the latency for memory access is improved, the system performance is improved.

Since a directional coupler is formed within a memory module, intervals between memory modules on the mother board can be shortened irrespective of the length of the directional coupler. As a result, it is possible to realize high-density mounting, while maintaining high-speed operation.

Figure 4:
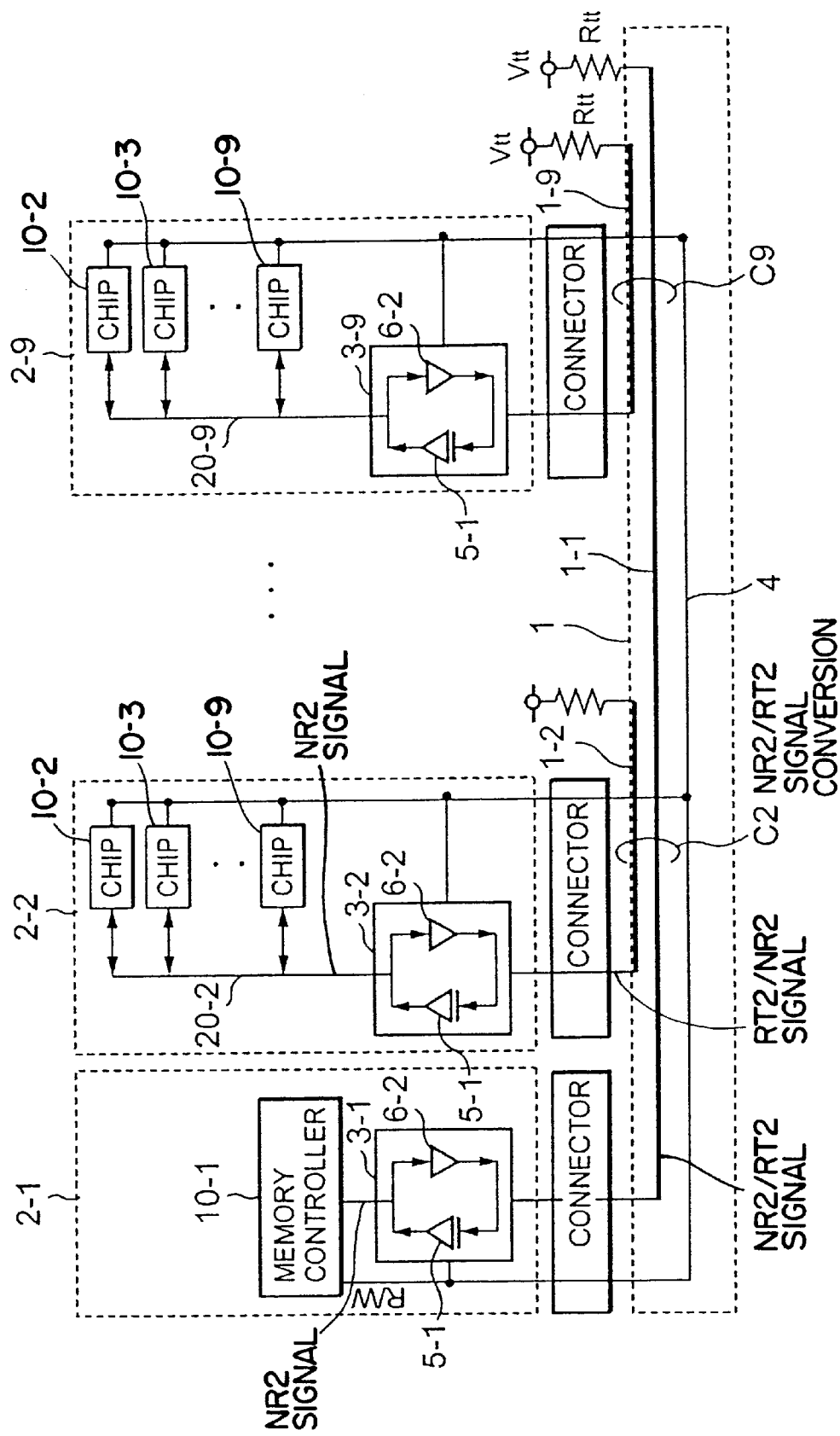
FIG. 4 shows a system in which multi-bank type memory modules are mounted with high density according to a second embodiment.

Further, as shown in FIG. 4, in the case that the transceivers 3-2–3-9 are connected to the bus through the directional couplers, the lines 20-2–20-9 transmit a signal that has been demodulated to an NRZ signal having large signal amplitude, and accordingly, data can be written at a high speed into each of the multiple memory chips connected. In the case of read operation too, the above applies in reversed order. Thus, by intermediately employing the transceivers, it is possible to realize a multi-bank structure in which an increased number of memory chips are connected for one signal, thus realizing still larger storage capacity, while maintaining high-speed operation.

Further, when the T-shaped couplers are used as shown in FIG. 5, the waveform becomes sharpened, thus having compensating effect for the skin effect. Accordingly, high speed operation can be realized.

Further, as shown in FIGS. 12, 13 and 14, when lines of a clock signal and data signal for a plurality of memories are folded and the clock signal is inputted back, a time difference in read data and write data can be eliminated. This makes system design very easy.

What is claimed is:

1. A directional coupling memory module comprising:

a memory; and a line which is coupled to said memory, wherein a memory bus for transferring data between a memory controller and said memory is constructed by using a directional coupler which is constituted of a part of a terminated main line from said memory controller and a terminated part of said line from said memory, and wherein said terminated main line, which is coupled to said line using said directional coupler, is serially connected to said module through a connector.

2. A directional coupling memory module according to claim 1, wherein said directional coupler is a T-shaped directional coupler in which said main line from said memory branches in a T-shape into a branch lines with both ends being terminated, and combinations of said branch lines and the main line constitute said directional coupler.

3. A directional coupling memory module according to claim 1, wherein a write data signal is sent from said memory controller in the same cycle with a write command signal.

4. A directional coupling memory module according to claim 2, wherein a write data signal is sent from said memory controller in the same cycle with a write command signal.

5. A directional coupling memory module comprising:

a memory; and a line which is coupled to said memory, wherein a memory bus for transferring data between a memory controller and said memory is constructed by using a directional coupler which is constituted of a part of a terminated main line from said memory controller and a terminated part of said line from said memory, and wherein a write data signal is sent from said memory controller in the same cycle with a write command signal.

6. A directional coupling memory module according to claim 5, wherein said directional coupler is a T-shaped directional coupler is which said main line drawn from said memory branches in a T-shape into branch lines with both ends being terminated, and combinations of said branch lines and the main line constitute said directional coupler.

* * * * *